United States Patent
Vimercati

(10) Patent No.: US 11,183,242 B1
(45) Date of Patent: Nov. 23, 2021

(54) PREVENTING PARASITIC CURRENT DURING PROGRAM OPERATIONS IN MEMORY

(71) Applicant: Micron Technology, Inc., Boise, ID (US)

(72) Inventor: Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/876,345

(22) Filed: May 18, 2020

(51) Int. Cl.
  *G11C 16/04* (2006.01)
  *H01L 27/1156* (2017.01)
  *G11C 16/26* (2006.01)
  *G11C 16/10* (2006.01)

(52) U.S. Cl.
  CPC ............ *G11C 16/045* (2013.01); *G11C 16/10* (2013.01); *G11C 16/26* (2013.01); *H01L 27/1156* (2013.01)

(58) Field of Classification Search
  CPC ....... G11C 16/045; G11C 16/26; G11C 16/10; H01L 27/1156
  See application file for complete search history.

(56) References Cited

U.S. PATENT DOCUMENTS

| | | | |
|---|---|---|---|
| 6,166,938 | A | 12/2000 | Wong |
| 8,320,181 | B2 | 11/2012 | Violette |
| 2009/0185426 | A1* | 7/2009 | Wang ................ G11C 11/404 365/185.18 |
| 2009/0237997 | A1 | 9/2009 | Rao |
| 2015/0001608 | A1 | 1/2015 | Tan et al. |
| 2017/0084648 | A1* | 3/2017 | Liu ................ H01L 27/14603 |
| 2017/0294231 | A1 | 10/2017 | Park |

FOREIGN PATENT DOCUMENTS

KR    10-1722800 B1    4/2017

OTHER PUBLICATIONS

U.S. Appl. No. 16/282,749, entitled "Source Line Configurations for a Memory Device", filed Feb. 22, 2019, Micron Reference No. 2018-0943.00/US, 54 pages.
International Search Report and Written Opinion for related International Application No. PCT/US2021/028296, dated Aug. 4, 2021, 9 pages.

* cited by examiner

*Primary Examiner* — Uyen Smet
(74) *Attorney, Agent, or Firm* — Brooks, Cameron & Huebsch, PLLC

(57) ABSTRACT

The present disclosure includes apparatuses, methods, and systems for preventing parasitic current during program operations in memory. An embodiment includes a sense line, an access line, and a memory cell. The memory cell includes a first transistor having a floating gate and a control gate, wherein the control gate of the first transistor is coupled to the access line, and a second transistor having a control gate, wherein the control gate of the second transistor is coupled to the access line, a first node of the second transistor is coupled to the sense line, and a second node of the second transistor is coupled to the floating gate of the first transistor. The memory cell also includes a diode, or other rectifying element, coupled to the sense line and a node of the first transistor.

25 Claims, 5 Drawing Sheets

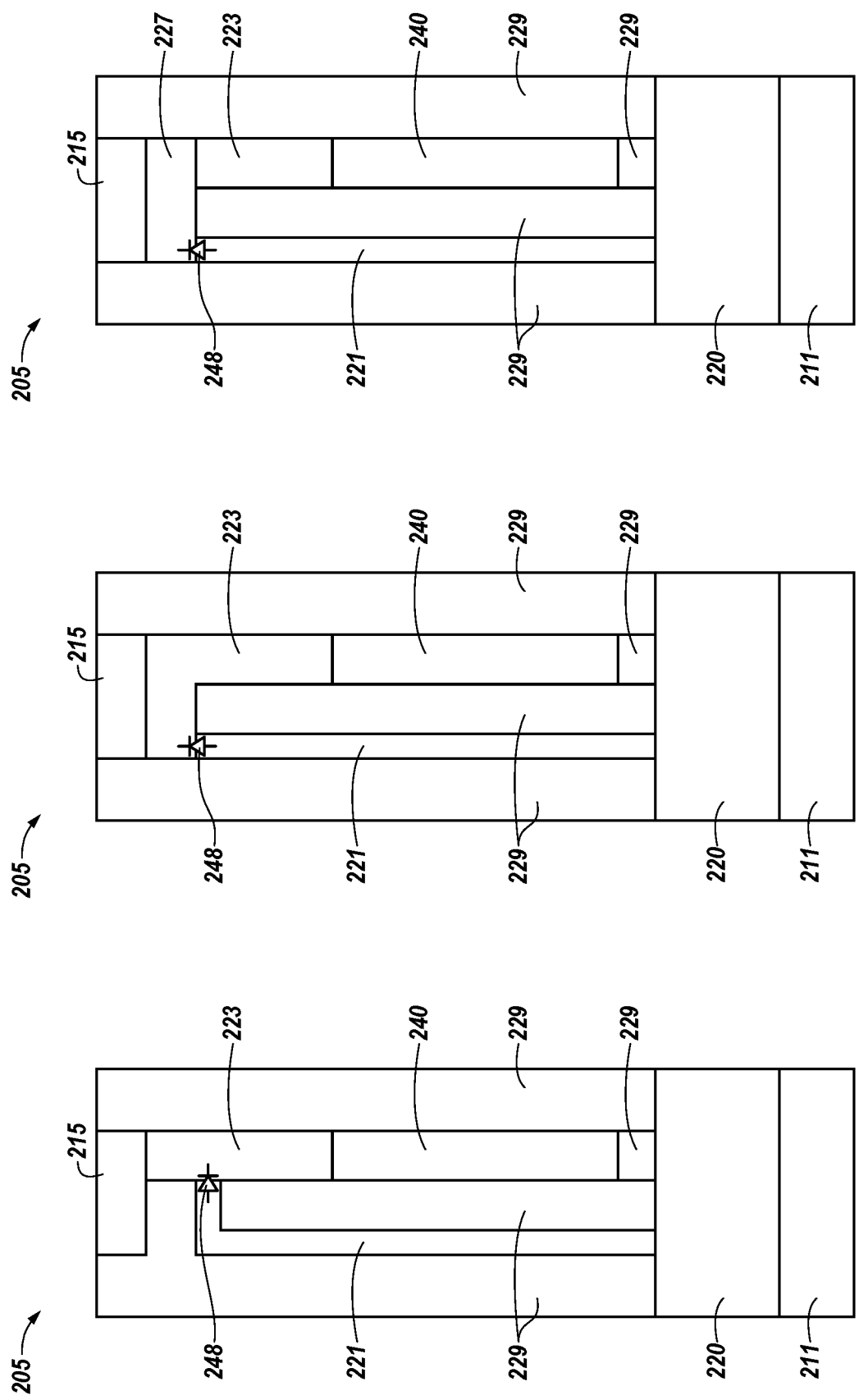

US 11,183,242 B1

PREVENTING PARASITIC CURRENT DURING PROGRAM OPERATIONS IN MEMORY

TECHNICAL FIELD

The present disclosure relates generally to semiconductor memory and methods, and more particularly, to preventing parasitic current during program operations in memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

A memory device may include one or more memory cells that are programmable to different target data states. For instance, a memory cell (e.g., a single level cell (SLC)) may be programmed to one of two possible data states (e.g., logic state 0 or logic state 1).

To store information, a component of the memory device may program (e.g., write) a memory cell of the memory device to a data state. To access the stored information, a component of the memory device may sense (e.g., read) the stored data state of the memory cell. For instance, during a read or write operation performed on a memory cell, a component of the memory device may apply a voltage to (e.g., bias) various conductive lines. These conductive lines may include access (e.g., word) lines, sense (e.g., digit) lines, and/or other types of conductive lines that may be coupled with the memory cell.

BRIEF DESCRIPTION OF THE DRAWINGS

FIGS. 2A-2C illustrate cross-sectional views of example memory cells in accordance with an embodiment of the present disclosure.

DETAILED DESCRIPTION

Figure 1:
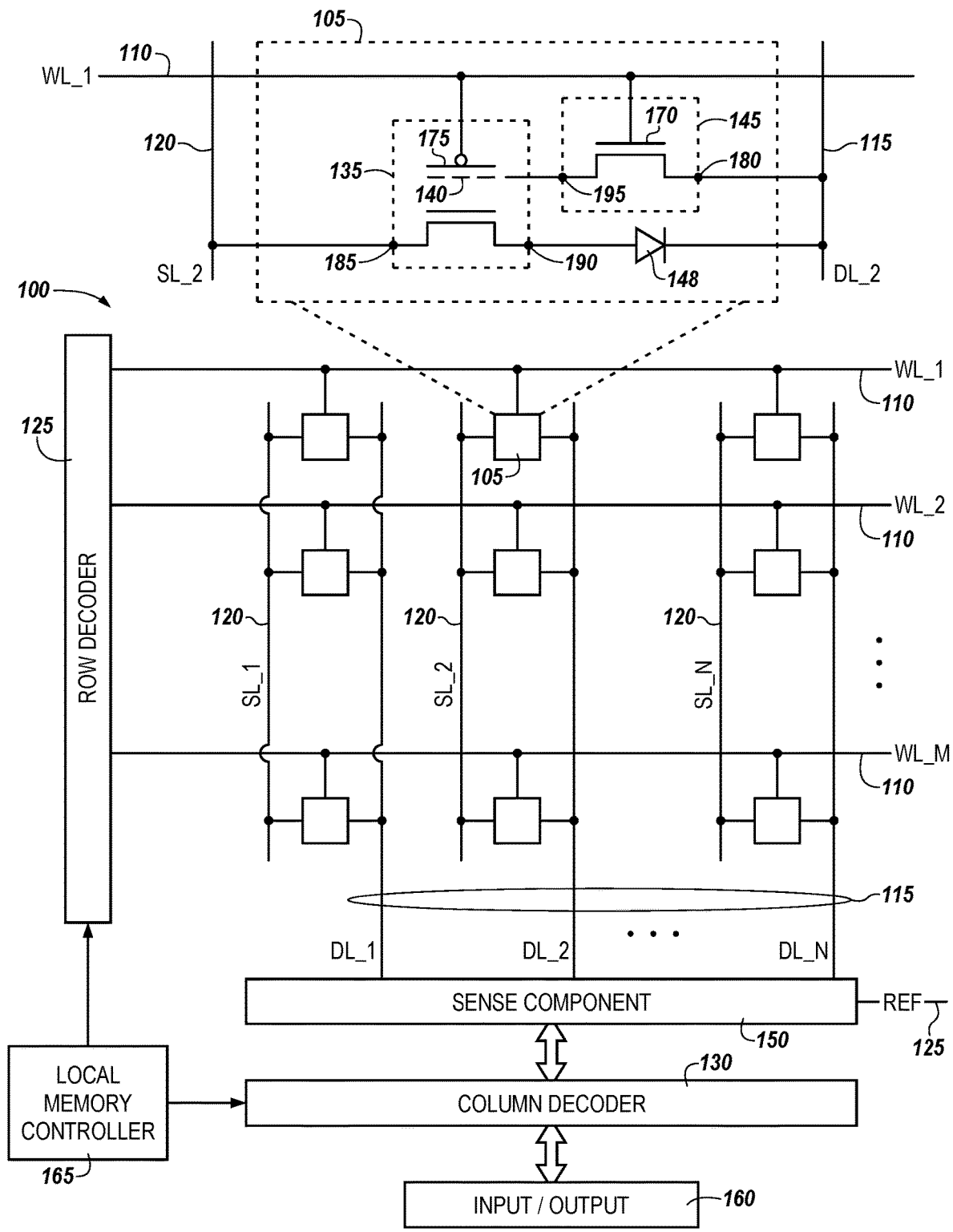
FIG. 1 illustrates an example of a memory die in accordance with an embodiment of the present disclosure.

The present disclosure includes apparatuses, methods, and systems for preventing parasitic current during program operations in memory. An embodiment includes a sense line, an access line, and a memory cell. The memory cell includes a first transistor having a floating gate (e.g., a gate that can be uncoupled from any voltage sources or voltage rails) and a control gate, wherein the control gate of the first transistor is coupled to the access line, and a second transistor having a control gate, wherein the control gate of the second transistor is coupled to the access line, a first node of the second transistor is coupled to the sense line, and a second node of the second transistor is coupled to the floating gate of the first transistor. The memory cell also includes a diode, or other rectifying element, coupled to the sense line and a node of the first transistor.

A memory cell can store a data (e.g., logic) state using two transistors, one of which may be associated with (e.g., include) a floating gate. The floating gate may be an electrical node that is in close proximity to a control gate of the transistor but is separated from the control gate by a dielectric material. A voltage or charge stored on the floating gate may affect a threshold voltage of the transistor associated with the floating gate and therefore may also affect an amount of current that flows through the transistor when a voltage is applied to the control gate. The amount of current that flows through the transistor may be sensed to determine the data state stored by the memory cell. This type of memory cell, which may be referred to as a floating gate memory cell, may not use a capacitor for storing the data state. Instead, a memory cell with a floating gate may store the data state based on a voltage of the floating gate.

A floating gate memory cell may include a first transistor for storing a data state and a second transistor for selectively accessing the floating gate of the first transistor. The description herein may refer to the first transistor associated with the floating gate as a read transistor because this transistor may be activated during a sense (e.g., read) operation to read the state of the memory cell. The second transistor in the memory cell may be referred to as a write transistor because the second transistor may be activated during a program (e.g., write) operation to apply a voltage to the floating gate of the first transistor.

A floating gate memory cell may be coupled with various conductive lines. These conductive lines may include an access (e.g., word) line and a sense (e.g., digit) line, such as the word lines and digit lines used with other types of memory cells. A floating gate memory cell may also be coupled with a conductive line referred to as a source line.

A floating gate memory cell may be read or written by applying a voltage to (e.g., biasing) the conductive lines associated with the memory cell, such as a word line, digit line, and source line. For example, a word line may be coupled with the control gates of the read transistor and write transistor and may be biased to select a target memory cell during a read or write operation. A digit line may be coupled with the drains of the read transistor and write transistor, and may be biased to apply a voltage to the floating gate during a write operation (via the write transistor) or to cause a current to flow between the digit line and a source line during a read operation (via the read transistor). The source line may be biased to a relatively low voltage (e.g., a ground voltage) during a read operation to enable electrical current to flow from the digit line to the source line via the read transistor.

In some cases, if the source line is biased to a low voltage (e.g., 0 Volts) during a write operation while the digit line is biased to a higher voltage (e.g., 2 Volts) to write a data state to a selected memory cell, the voltage difference between the digit line and the source line may cause a parasitic electrical current, which may also be referred to as a leakage current, to flow through unselected memory cells that are coupled with the same digit line and source line. The cumulative parasitic current that may occur during write operations, which may be referred to as write disturb, may cause undesirable effects in the memory device, such as reducing the reliability and/or lifetime of the memory cells of the device, among other undesirable effects.

Embodiments of the present disclosure, however, can prevent this parasitic current from flowing through unselected memory cells, and therefore can prevent write disturb from occurring, during write operations being performed on the memory cells of a memory device. For example, memory cells (e.g., floating gate memory cells) in accordance with the present disclosure may include a diode coupled to (e.g., in series with) the read transistor of the cell and the digit line associated with (e.g., coupled to) the cell. During a write operation, the diode of an unselected memory cell can prevent the parasitic current from flowing through the unselected cell. Accordingly, memory cells in accordance with the present disclosure can have an increased reliability and/or increased lifetime as compared with previous memory cells.

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designators "N" and "M", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 105 may reference element "05" in FIG. 1, and a similar element may be referenced as 205 in FIGS. 2A-2C.

FIG. 1 illustrates an example of a memory die 100 in accordance with an embodiment of the present disclosure. In some cases, the memory die 100 may be referred to as a memory chip, a memory device, or an electronic memory apparatus.

As shown in FIG. 1, the memory die 100 may include one or more memory cells 105 that are programmable to store different data states. For instance, each memory cell 105 may be programmable to store one of two or more data states. For example, the memory cell 105 may be configured to store one bit of digital logic at a time (e.g., a logic 0 or a logic 1). In some cases, a single memory cell 105 (e.g., a multi-level memory cell) may be configured to store more than one bit of digital logic at a time (e.g., a logic 00, logic 01, logic 10, or a logic 11). In the floating gate memory architecture illustrated in FIG. 1, the memory cell 105 may include two transistors (e.g., 135 and 145), one of which is associated with a floating gate, as will be further described herein. The floating gate may be configured to store a charge representative of the programmable data state.

Operations such as sensing (e.g., reading) and programming (e.g., writing) may be performed on floating gate memory cells 105 by activating, selecting, or biasing access lines such as an access (e.g., word) line 110, a sense (e.g., digit) line 115, and/or a source line 120. In some cases, digit lines 115 may also be referred to as bit lines. Activating, selecting, or biasing a word line 110, a digit line 115, or a source line 120 may include applying a voltage to the respective line, as will be further described herein.

As shown in FIG. 1, the memory die 100 may include conductive lines (e.g., the word lines 110, the digit lines 115, and the source lines 120) arranged in a grid-like pattern. Memory cells 105 may be positioned at intersections of the word lines 110, the digit lines 115, and/or the source lines 120. By applying a voltage to (e.g. biasing) a word line 110, a digit line 115, and/or a source line 120, a single memory cell 105 may be accessed at their intersection. The memory cells 105 associated with (e.g., coupled to) a particular word line 110 may be referred to as a row of memory cells, and the memory cells associated with (e.g., coupled to) a particular digit line 115 may be referred to as a column of memory cells.

Accessing the memory cells 105 may be controlled through a row decoder 125 and a column decoder 130. For example, a row decoder 125 may receive a row address from the local memory controller 165 and activate a word line 110 based on the received row address. A column decoder 130 receives a column address from the local memory controller 165 and activates a digit line 115 based on the received column address.

For example, the memory die 100 may include multiple word lines 110, labeled WL_1 through WL_M, multiple digit lines 115, labeled DL_1 through DL_N, and multiple source lines, labeled SL_1 through SL_N, where M and N depend on the size of the memory array. In some cases, the quantity of source lines N corresponds to the quantity of digit lines N such that each digit line 115 has a corresponding source line 120 that is associated with the same memory cells 105 as the digit line 115. Thus, by activating or biasing a word line 110, a digit line 115, and a source line 120 (e.g., WL_1, DL_2, and SL_2,) the memory cell 105 at their intersection may be accessed. The intersection of a word line 110 and a digit line 115, in either a two-dimensional or three-dimensional configuration, may be referred to as an address of a memory cell 105. In some cases, the intersection of a word line 110, a digit line 115, and a source line 120 may be referred to as an address of the memory cell 105.

As shown in FIG. 1, the memory cell 105 may include a read transistor 135 associated with (e.g., including) a floating gate 140, and a write transistor 145. Read transistor 135 and write transistor 145 may be used together to read and write data states to memory cell 105.

For example, floating gate 140 may be used to store a charge or voltage representing a logic state of memory cell 105. Floating gate 140 may be an electrical node that is located near a control gate 175 of read transistor 135 such that a charge or voltage on floating gate 140 may affect a threshold voltage associated with read transistor 135. A control gate 175 may be a gate of a transistor that is used to activate or deactivate the transistor, for example. Read transistor 135 may be associated with floating gate 140 at least because a threshold voltage of read transistor 135 may be affected by a charge or voltage on floating gate 140. A threshold voltage may be a minimum voltage that must be applied to a control gate of a transistor to fully activate the transistor and couple the source node of the transistor with the drain node of the transistor. As used herein, the term "floating" can mean uncoupled from any voltage sources or voltage rails, and floating gate 140 may be considered to be "floating" only during read operations and while being used to store data.

In some cases, read transistor 135 may include floating gate 140. That is, read transistor 135 may be a floating gate transistor that includes floating gate 140. In some cases, read transistor 135 may be a transistor (e.g., not a floating-gate transistor) that does not include floating gate 140. In this case, floating gate 140 may be an electrical node that is fabricated in close proximity to a control gate of read transistor 135, but is not included within read transistor 135. Floating gate 140 may be coupled with a drain node 195 of write transistor 145, as illustrated in FIG. 1.

In some cases, read transistor 135 may be a first type of transistor, and write transistor 145 may be a second type of transistor. For example, read transistor 135 may be a p-type metal-oxide-semiconductor (PMOS) transistor and write transistor 145 may be an n-type metal-oxide-semiconductor (NMOS) transistor, as illustrated in FIG. 1. However, in some cases, the types, and similarly the references to the source and drain nodes of, read transistor 135 and write transistor 145 may be reversed. In some cases, the read transistor 135 and the write transistor 145 may be the same type of transistor (e.g., both PMOS or both NMOS).

A word line 110 may be a conductive line coupled with a memory cell 105 that is used to perform access operations on the memory cell 105. As shown in FIG. 1, the word line 110 may be coupled with a control gate 175 of read transistor 135 and with a control gate 170 of write transistor 145. In some cases, the word line 210 may be configured to control activation of the read transistor 135 and the write transistor 145 during memory cell accesses by applying a voltage to control gate 175 and control gate 170. In some cases, because read transistor 135 and write transistor 145 are different type transistors, applying a voltage to word line 110 may activate either read transistor 135 or write transistor 145 but may not activate both transistors at the same time. In some cases, word line 110 may be biased, during a read operation, to a voltage that activates read transistor 135 but does not activate write transistor 145. In some cases, word line 110 may be biased, during a write operation, to a voltage that activates write transistor 145 but does not activate read transistor 135.

A digit line 115 may be a conductive line that connects the memory cell 105 with a sense component 150 and is used to perform access operations on the memory cell 105. Digit line 115 may be coupled to a source node 180 of write transistor 145 and to a drain node 190, as illustrated in FIG. 1.

A source line 120 may be a conductive line coupled with a memory cell 105 that is used to perform access operations on the memory cell 105. The source line 120 may be coupled with a source node 185 of the read transistor 135. In some memory devices, a common source plate (e.g., a ground plate) may be coupled with every memory cell via source lines 120. For instance, the common source plate (not shown in FIG. 1 for clarity and so as not to obscure embodiments of the present disclosure) may be coupled to source lines 120, which can be coupled to the source nodes 185 of the read transistors 135 of each memory cell 105. Utilizing a common source plate in such an architecture can reduce the number of components (e.g., drivers) associated with source lines 120.

During a write operation, word line 110 may be biased to a write voltage that activates write transistor 145 of the selected memory cell 105, and digit line 115 may be biased to a state voltage that is based on the data state to be stored by the selected memory cell 105. For example, digit line 115 may be biased to a higher voltage to store a logic state of "1" and a lower voltage to store a logic state of "0." Activating write transistor 145 may couple the source node 180 of write transistor 145 with the drain node 195 of write transistor 145, thereby causing a voltage to be applied to floating gate 140 that is based on the voltage of digit line 115. After the voltage has been applied to the floating gate 140, word line 110 may be biased to a voltage that deactivates write transistor 145, thereby isolating the floating gate 140 and storing the applied voltage on floating gate 140. In some cases, read transistor 135 may remain inactive during the write operation. An example write operation will be further described herein (e.g., in connection with FIG. 3A).

During a read operation, word line 110 may be biased to a read voltage that may activate read transistor 135 of the selected memory cell 105, and write transistor 145 of the selected memory cell 105 may remain inactive. Activating read transistor 135 may couple a drain node 190 of read transistor 135 with a source node 185 of read transistor 135, thereby coupling digit line 115 with source line 120. During the read operation, digit line 115 may be biased to a small negative voltage and source line 120 may be grounded (e.g., using the common source plate) such that an electrical current may flow from source line 120 to digit line 115 when read transistor 135 is activated. The amount of current that flows from source line 120 to digit line 115 may be affected by the data state stored by memory cell 105. That is, the voltage or charge stored on floating gate 140 may affect the threshold voltage associated with read transistor 135, thereby affecting the level of activation of read transistor 135 in response to the read voltage. The level of activation of read transistor 135 may, in turn affect the amount of current that flows between the source line 120 and the digit line 115. An example read operation will be further described herein (e.g., in connection with FIG. 3B).

As shown in FIG. 1, the memory cell 105 can include a diode 148 coupled to (e.g., in series with) digit line 115 and drain node 190 of read transistor 135. Diode 148 can be, for example, a bipolar junction diode. When the memory cell 105 is an unselected cell during a write operation (e.g., a cell that is not being written, but that is connected to the same digit line 115 as the cell that is being written during the write operation), diode 148 can prevent a current (e.g., a parasitic or leakage current) from flowing through the memory cell 105 (e.g., from the digit line 115 through read transistor 135 of the cell). However, when the memory cell 105 is a selected cell during a read operation (e.g., the cell that is being read during the read operation), diode 148 can allow current to flow through memory cell 105 (e.g., from source line 120 to digit line 115 through read transistor 135 of the cell). Operation of diode 148 during write and read operations will be described further herein (e.g., in connection with FIGS. 3A and 3B). Further, although a diode is illustrated in FIG. 1, embodiments of the present disclosure are not so limited, and could include another type of rectifying element with analogous functionality in place of diode 148.

The sense component 150 may be configured to detect a state (e.g., a charge or voltage) stored on floating gate 140 of the memory cell 105 and determine a data state of the memory cell 105 based on the detected state. In some cases, sense component 150 may detect the state by detecting an amount of electrical current flowing between digit line 115 and source line 120 during a read operation, which may be considered as a signal output by the memory cell 105. In some cases, the sense component 150 may include one or more sense amplifiers to amplify the signal output of the memory cell 105. The sense amplifiers may detect minute changes in the current along a digit line 115 during a read operation and may produce signals corresponding to either a logic 0 or a logic 1 based on the detected current.

The sense component 150 may be configured to compare the signal received from the memory cell 105 across the digit line 115 to a reference signal 155 (e.g., a reference voltage or current). The sense component 150 may determine the stored state of the memory cell 105 based on the comparison. For example, in binary-signaling, if digit line 115 has a higher voltage or current than the reference signal 155, the sense component 150 may determine that the stored data state of memory cell 105 is a logic 1, and, if the digit line 115 has a lower voltage or current than the reference signal 155, the sense component 150 may determine that the stored state of the memory cell 105 is a logic 0. The sense component 150 may include various transistors or amplifiers to detect and amplify a difference in the signals. The detected logic state of memory cell 105 may be output through column decoder 130 as output 160. In some cases, the sense component 150 may be part of another component (e.g., a column decoder 130, row decoder 125). In some cases, the sense component 150 may be in electronic communication with the row decoder 125 and/or the column decoder 130.

The local memory controller 165 may control the operation of memory cells 105 through the various components (e.g., row decoder 125, column decoder 130, and sense component 150). In some cases, one or more of the row decoder 125, column decoder 130, and sense component 150 may be co-located with the local memory controller 165. The local memory controller 165 may be configured to receive one or more commands and/or data from an external memory controller or device, translate the commands and/or data into information that can be used by the memory die 100, perform one or more operations on the memory die 200 (e.g., write and read operations as described herein), and communicate data from the memory die 100 to the external memory controller or device in response to performing the one or more operations. The local memory controller 165 may generate row, column, and/or source line address signals to bias or activate the target word line 110, the target digit line 115, and the target source line 120. The local memory controller 165 may also generate and control various voltages or currents used during the operation of the memory die 100. In general, the amplitude, shape, or duration of an applied voltage or current described herein may be adjusted or varied and may be different for the various operations described in operating the memory die 100.

FIGS. 2A-2C illustrate cross-sectional views of example memory cells 205 in accordance with an embodiment of the present disclosure. Memory cells 205 can be, for instance, memory cells 105 previously described in connection with FIG. 1 (e.g., FIG. 2A illustrates a first example of memory cells 105, FIG. 2B illustrates a second example of memory cells 105, and FIG. 2C illustrates a third example of memory cells 105).

As shown in FIGS. 2A-2C, memory cells 205 can each include a diode 248 (e.g., diode 148 of FIG. 1), with a p-type (e.g., p-doped) channel 221 in contact with an n-type (e.g., n-doped) material of diode 248. P-type channel 221 can be a channel (e.g., a poly channel) of the read transistor of memory cell 205 (e.g., read transistor 135 of FIG. 1). P-type channel 221 can also be in contact with source line 220 (e.g., source line 120 of FIG. 1), which in turn is in contact with common source plate (e.g., ground plate) 211, as illustrated in FIGS. 2A-2C.

As shown in FIGS. 2A-2C, memory cells 205 can each include an n-type channel 223. N-type channel 223 can be a channel (e.g., an n-channel) of the write transistor of memory cell 205 (e.g., write transistor 145 of FIG. 1). In the examples illustrated in FIGS. 2A and 2B, n-type channel 223 is in contact with a p-type material of diode 248 and with digit line 215 (e.g., digit line 115 of FIG. 1). In the example illustrated in FIG. 2C, n-type channel 223 is in contact with an additional n-doped material 227 of the memory cell, which in turn is in contact with the p-type material of diode 248 and digit line 215.

As shown in FIGS. 2A-2C, memory cells 205 can each include a floating gate 240 (e.g., floating gate 140 of FIG. 1) in contact with n-type channel 223. Floating gate 240 can be the floating gate of the read transistor of memory cell 205.

As shown in FIGS. 2A-2C, memory cells 205 can each include an oxide material 229 in contact with digit line 215, n-type channel 223, p-type channel 221, floating gate 240, and source line 220. For example, oxide material 229 can be between p-type channel 221 and n-type channel 223, and between p-type channel 221 and floating gate 240, as illustrated in FIGS. 2A-2C. Further, oxide material 229 can be between floating gate 240 and source line 220, as shown in FIGS. 2A-2C. Further, oxide material 229 can be in contact with n-doped material 227, as illustrated in FIG. 2C. Oxide material 229 can comprise the control gates of the read and write transistors of memory cell 205 (e.g., control gates 175 and 170 of FIG. 1).

In the examples illustrated in FIGS. 2A-2C, p-type channel 221 can have a thickness (e.g., width) of 7 nanometers (nm), n-type channel 223 can have thickness of 10 nm, floating gate 240 can have a thickness of 10 nm, the oxide material 229 between p-type channel 221 and n-type channel 223 can have a thickness of 5 nm, the oxide material 229 between p-type channel 221 and floating gate 240 can have a thickness of 5 nm, the oxide material 229 on the opposite side of p-type channel 221 can have a thickness of 9 nm, the oxide material 229 on the opposite side of n-type channel 223 and floating gate 240 can have a thickness of 9 nm, and memory cell 205 can have a thickness of 40 nm. However, embodiments of the present disclosure are not limited to these particular thicknesses.

Figure 3A:
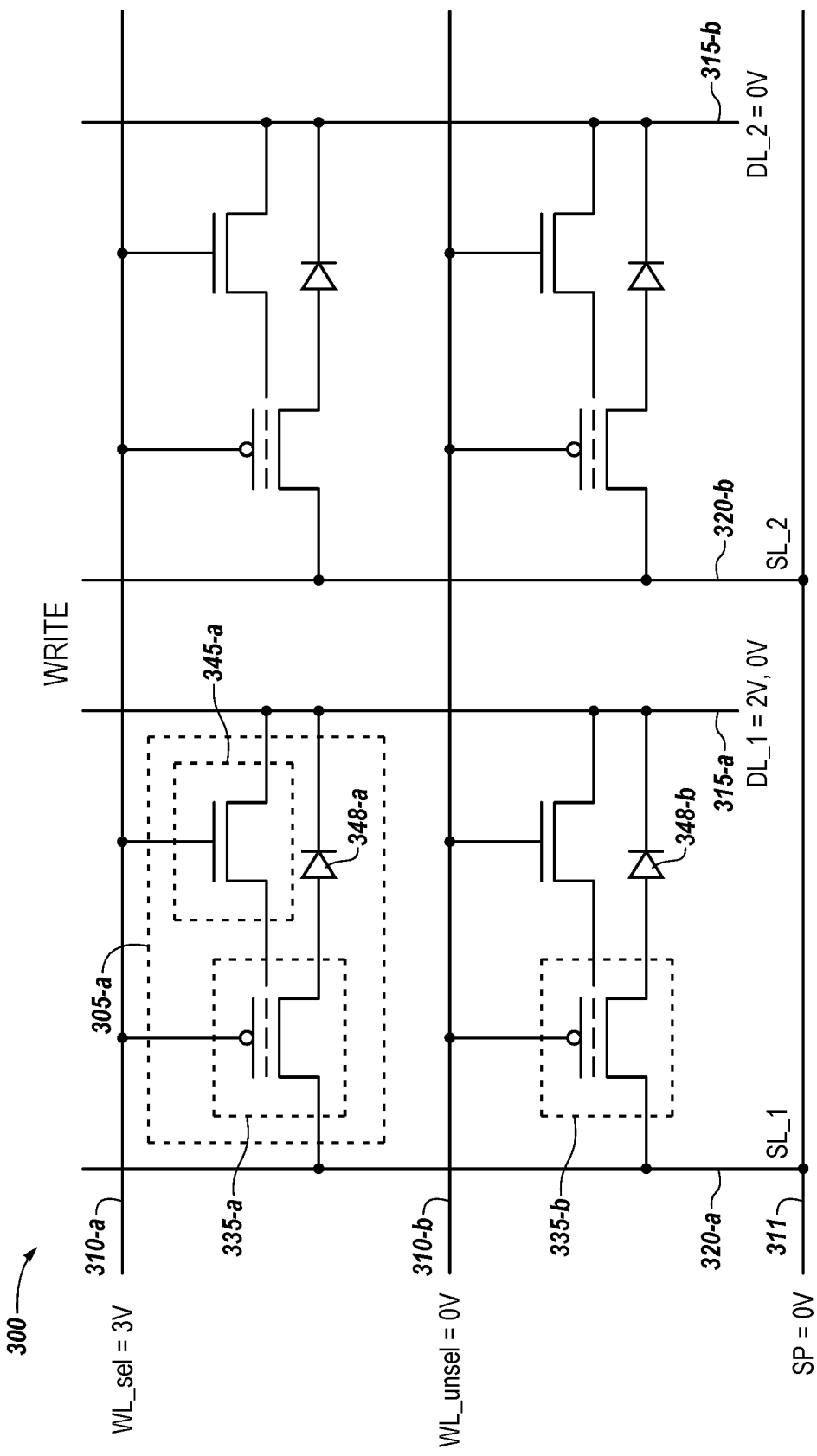
FIGS. 3A-3B illustrate examples of conductive line biasing during write and read operations performed on a memory device in accordance with an embodiment of the present disclosure.
Figure 3B:
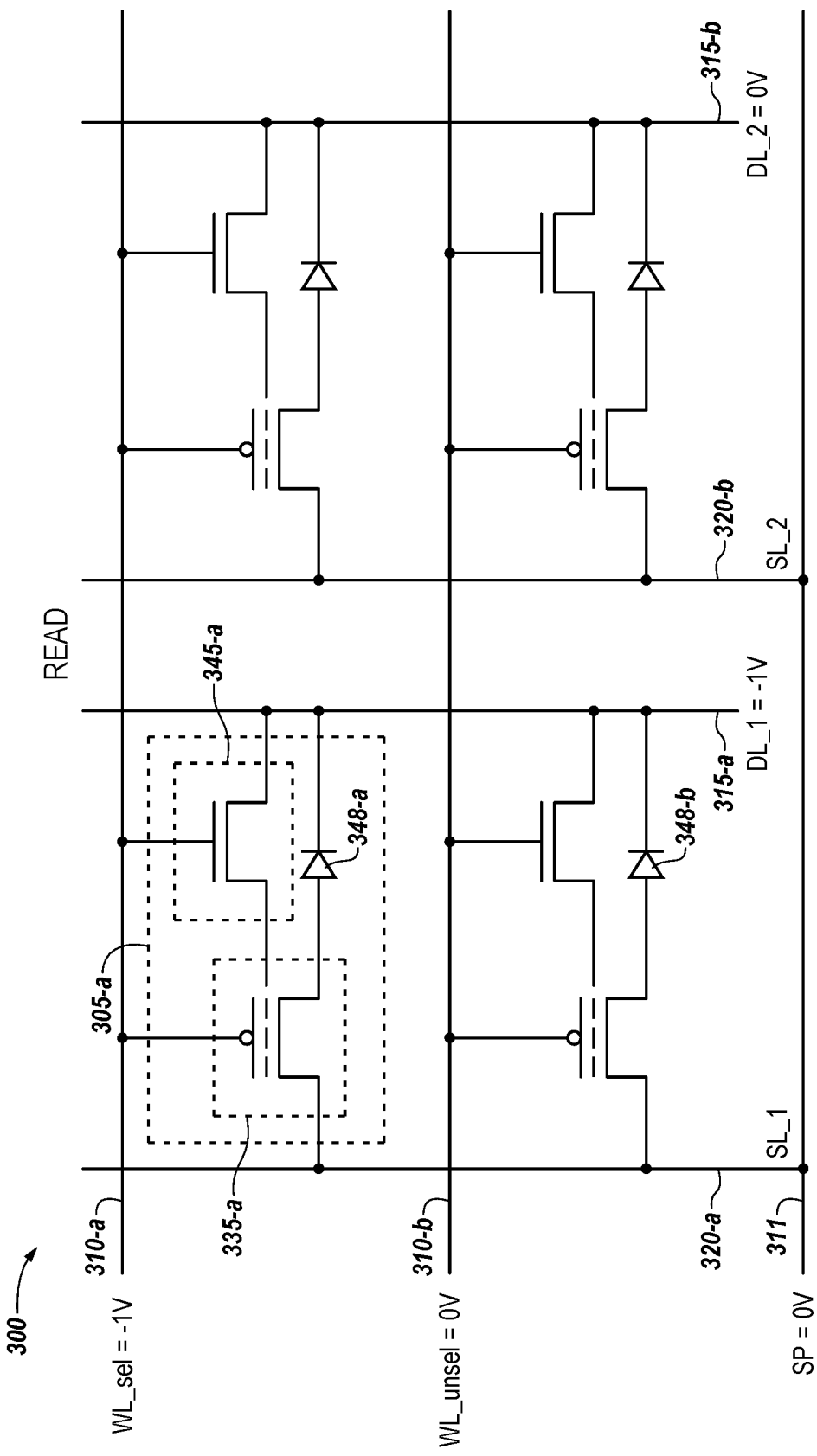

FIG. 3A illustrates an example of conductive line biasing during a program (e.g., write) operation performed on a memory device 300 in accordance with an embodiment of the present disclosure. FIG. 3B illustrates an example of conductive line biasing during a sense (e.g., read) operation performed on memory device 300 in accordance with an embodiment of the present disclosure.

Memory device 300 can be, for instance, memory device 100 previously described in connection with FIG. 1. For example, as shown in FIGS. 3A and 3B, memory device 100 can include multiple memory cells, including target memory cell 305-*a* (e.g., the cell being selected during the write and read operations). Each of the memory cells, including target memory cell 305-*a*, may be an example of a floating gate memory cell 105 described in connection with FIG. 1. For instance, target memory cell 305-*a* includes a read transistor 335-*a* (e.g., read transistor 135 of FIG. 1) that is associated with a floating gate (e.g., floating gate 140 of FIG. 1) and a write transistor 345-*a* (e.g., write transistor 145 of FIG. 1), as illustrated in FIGS. 3A-3B. Further, target memory cell 305-*a* includes a diode 348-*a* (e.g., diode 148 of FIG. 1) coupled to digit line 315-*a* (e.g., digit line 115 of FIG. 1) and the drain node of read transistor 335-*a*, as illustrated in FIGS. 3A-3B.

In some cases, write transistors 345 in memory device 300 may be activated when a first voltage is applied to their control gate, and read transistors 335 in memory device 300 may be activated when a second (e.g., different) voltage is applied to their control gate. In this example, the write transistors 345-a may be activated when a voltage of three (3) volts (V) is applied to their control gates, and read transistors 335 may be activated when a voltage of minus one (−1) volts (V) is applied to their control gates. The values of voltages described in FIGS. 3A-3B are meant as examples. The voltages may be any value or combinations of values that perform the functions described herein.

FIG. 3A depicts an example of conductive line biasing of a memory device 300 during a write operation. As shown in FIG. 3A, during a write operation on target memory cell 305-a, a word line 310-a associated with (e.g., connected to) target memory cell 305-a may be biased to a write voltage that activates write transistor 345-a but does not activate read transistor 335-a. The write voltage may be applied, via word line 310-a, to a control gate of write transistor 345-a and may be a voltage that exceeds a threshold voltage associated with write transistor 345-a, for example. In this example, the write voltage may be three (3) volts (V). Other word lines in memory device 300 that are associated with unselected memory cells, such as word line 310-b, may be biased to zero (0) volts (e.g., a ground voltage).

During the write operation, a digit line 315-a associated with (e.g., connected to) target memory cell 305-a may be biased to a state voltage that is based on the data (e.g., logic) state to be written to target memory cell 305-a. For example, to write a logic state of "1," the digit line 315-a may be biased to a voltage that is less than the write voltage, such as, for instance, two (2) volts. To write a logic state of "0," the digit line 315-a may be biased to zero (0) volts. Other digit lines in memory device 300 that are associated with unselected memory cells, such as digit line 315-b, may be biased to zero (0) volts (e.g., a ground voltage).

As described with reference to FIG. 1, the memory cells 305 can include a diode 348, or other rectifying element, coupled to (e.g., in series with) digit line 315 and a drain node of read transistor 335. Diodes 348 (or the other rectifying elements) can prevent an electrical current, such as a parasitic (e.g., leakage) current that may otherwise have occurred during the write operation due to, for instance, the voltage difference between the digit line 315-a and the source line 320-a when writing a logic state of "1", from flowing through the unselected memory cells 305 (e.g., the other cells connected to digit line 315-a) during the write operation. For example, diode 348-b can prevent such a parasitic current from flowing from digit line 315-a through read transistor 335-b. Preventing such a parasitic current from flowing through the unselected memory cells 305 can increase the reliability and/or lifetime of the cells. For instance, although FIG. 3A depicts two memory cells coupled with digit line 315-a and source line 320-a, in practice there may be hundreds or thousands of memory cells coupled with these conductive lines. Thus, the cumulative amount of parasitic current that can be prevented from being conducted through read transistors 335 by diodes 348 during a write operation may be significant.

As described with reference to FIG. 1, a source node of write transistor 345-a may be coupled with digit line 315-a and a drain node of write transistor 345-a may be coupled with the floating gate of read transistor 235-a. Thus, when write transistor 345-a is activated by applying the write voltage to word line 310-a, a voltage may be applied to the floating gate of read transistor 235-a that is based on the state voltage applied to digit line 315-a. In some cases, the voltage applied to the floating gate may be substantially the same as the state voltage on digit line 315-a minus any voltage drop across write transistor 345-a.

After the voltage is applied to the floating gate of read transistor 235-a, word line 310-a may be set to zero (0) volts to deactivate write transistor 345-a, thereby decoupling the floating gate from digit line 315-a. The floating gate may be floating (e.g., uncoupled from any voltage sources or voltage rails) and may therefore store the voltage representing the logic state.

During the write operation, the source line 320-a associated with target memory cell 305-a may not be used and may be biased to zero (0) volts (e.g., a ground voltage). To simplify fabrication and source line biasing, in this example, multiple source lines 320 may be coupled with a single common source plate 311, which may be biased to zero (0) volts, as illustrated in FIG. 3A.

FIG. 3B depicts an example of conductive line biasing of the memory device 300 during a read operation on target memory cell 305-a. During a read operation on target memory cell 305-a, a word line 310-a associated with (e.g., connected to) target memory cell 305-a may be biased to a read voltage that activates read transistor 335-a but does not activate write transistor 345-a. The read voltage may be applied, via word line 310-a, to a control gate of read transistor 235-a and may be a voltage that exceeds a nominal threshold voltage associated with read transistor 335-a, for example. The nominal threshold voltage may be the threshold voltage of read transistor 335-a when the floating gate of read transistor 335-a is uncharged. In this example, the read voltage may be a negative voltage, such as minus one (−1) volts (V). Other word lines in memory device 300 that are associated with unselected memory cells, such as word line 310-b, may be biased to zero (0) volts (e.g., a ground voltage).

During the read operation, a digit line 315-a associated with (e.g., connected to) target memory cell 305-a may be biased to a read voltage. In this example, the read voltage may be minus one (−1) volts, and may be the same voltage regardless of the logic state stored by target memory cell 305-a. Other digit lines in memory device 300 that are associated with unselected memory cells, such as digit line 315-b, may be biased to zero (0) volts.

As described with reference to FIG. 1, a drain node of read transistor 335-a may be coupled with digit line 315-a and a source node of read transistor 335-a may be coupled with source line 320-a. During the read operation, the digit line 315-a is biased to a negative voltage (e.g., −1 V) that is the same as the read voltage to which the word line 310-a is biased. Thus, when read transistor 335-a is activated by applying the read voltage to word line 310-a, a current may flow between source line 320-a and digit line 315-a via read transistor 335-a. For instance, a current may flow from common source plate 311 to source line 320-a, from source line 320-a to the source node of read transistor 335-a, through read transistor 335-a, and from the drain node of read transistor 335-a to digit line 315-a. Further, diode 348-a can allow this current to flow between source line 320-a and digit line 315-a (e.g., the flow of this current through read transistor 335-a may not be inhibited or impeded by diode 348-a).

The amount of current conducted by read transistor 335-a may depend on the voltage stored on the floating gate of read transistor 335-a. Thus, the amount of current flowing from source line 320-a to digit line 315-a may be sensed by a sense amplifier to determine the logic state stored by target memory cell 305-a, as previously described herein (e.g., in connection with FIG. 1).

Figure 4:
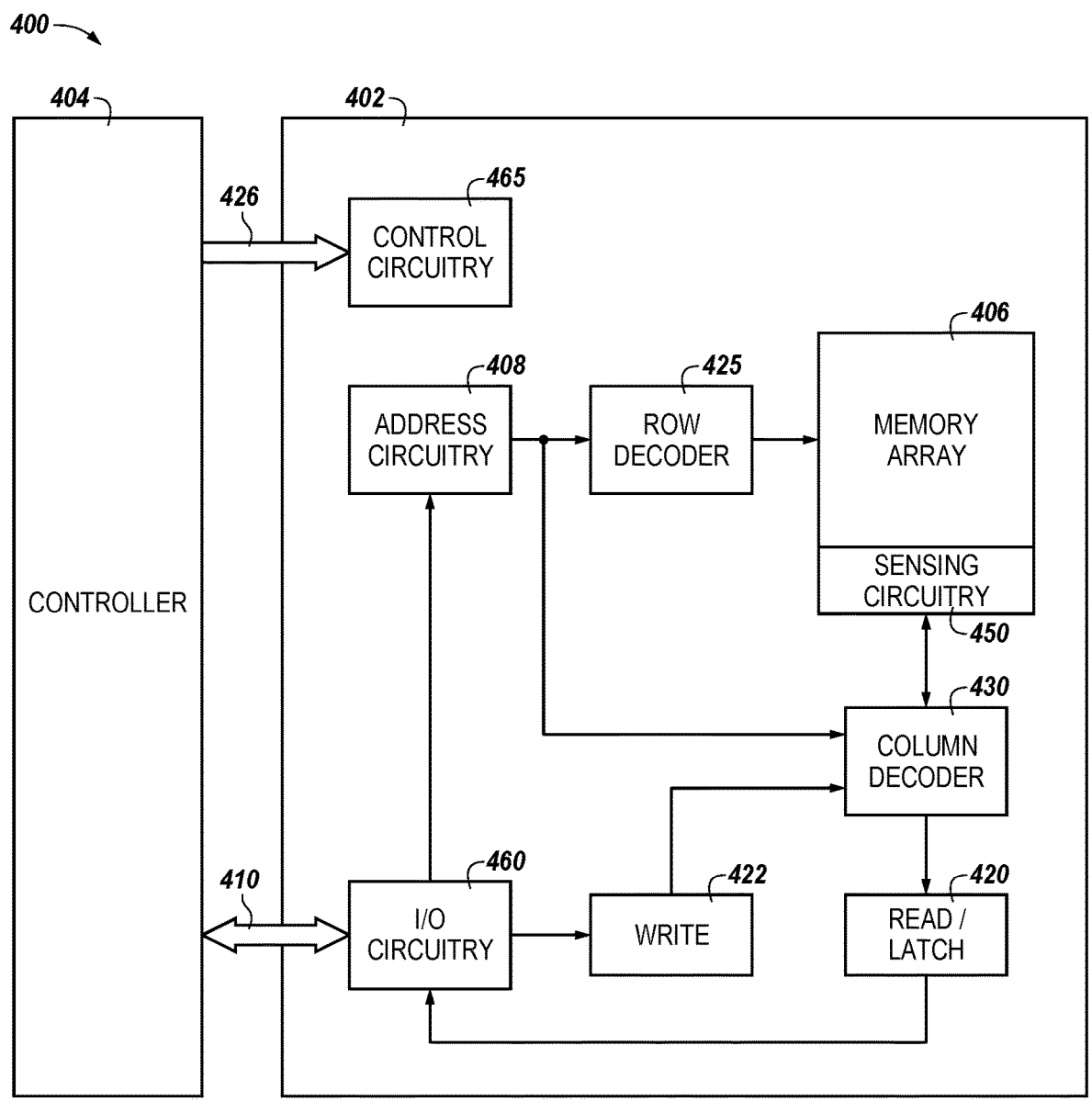
FIG. 4 is a block diagram illustration of an example apparatus, such as an electronic memory system, in accordance with an embodiment of the present disclosure.

FIG. 4 is a block diagram illustration of an example apparatus, such as an electronic memory system 400, in accordance with an embodiment of the present disclosure. Memory system 400 includes an apparatus, such as a memory device 402, and a controller 404, such as a memory controller (e.g., a host controller). Controller 404 might include a processor, for example. Controller 404 might be coupled to a host, for example, and may receive command signals (or commands), address signals (or addresses), and data signals (or data) from the host and may output data to the host.

Memory device 402 includes a memory array 406 of memory cells. For example, memory array 406 may include one or more arrays of memory cells, such as arrays of memory cells 105 previously described in connection with FIG. 1, as disclosed herein.

Memory device 402 includes address circuitry 408 to latch address signals provided over I/O connections 410 through I/O circuitry 460. Address signals are received and decoded by a row decoder 425 and a column decoder 430 to access the memory array 406. For example, row decoder 425 and/or column decoder 430 may be row decoder 125 and column decoder 130, respectively, previously described in connection with FIG. 1.

Memory device 402 may sense (e.g., read) data in memory array 406 by sensing voltage and/or current changes in the memory array columns using sense/buffer circuitry that in some examples may be read/latch circuitry 420 and/or sense circuitry 450. Sense circuitry 450 can be, for example, sense component 150 previously described in connection with FIG. 1. Read/latch circuitry 420 may read and latch data from the memory array 406. I/O circuitry 460 is included for bi-directional data communication, such as, for instance, the communication of sensed data (e.g., logic) states, over the I/O connections 410 with controller 404. Write circuitry 422 is included to write data to memory array 406 in accordance with embodiments of the present disclosure.

Control circuitry 465 may decode signals provided by control connections 426 from controller 404. These signals may include chip signals, write enable signals, and address latch signals that are used to control the operations on memory array 406, including data read and data write operations in accordance with the present disclosure.

Control circuitry 465 may be included in controller 404, for example. Controller 404 may include other circuitry, firmware, software, or the like, whether alone or in combination. Controller 404 may be an external controller (e.g., in a separate die from the memory array 406, whether wholly or in part) or an internal controller (e.g., included in a same die as the memory array 406). For example, an internal controller might be a state machine or a memory sequencer.

In some examples, controller 404 may be configured to cause memory device 402 to at least perform the methods disclosed herein, such as performing read and write operations on the memory cells of array 406 as disclosed herein. In some examples, memory device 402 may include the circuitry previously described in conjunction with FIG. 1.

As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

It will be appreciated by those skilled in the art that additional circuitry and signals can be provided, and that the memory system 400 of FIG. 4 has been simplified. It should be recognized that the functionality of the various block components described with reference to FIG. 4 may not necessarily be segregated to distinct components or component portions of an integrated circuit device. For example, a single component or component portion of an integrated circuit device could be adapted to perform the functionality of more than one block component of FIG. 4. Alternatively, one or more components or component portions of an integrated circuit device could be combined to perform the functionality of a single block component of FIG. 4.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
 a sense line;
 an access line; and
 a memory cell, wherein the memory cell includes:
  a first transistor having a floating gate and a control gate, wherein the control gate of the first transistor is coupled to the access line;
  a second transistor having a control gate, wherein:
   the control gate of the second transistor is coupled to the access line;
   a first node of the second transistor is coupled to the sense line; and
   a second node of the second transistor is coupled to the floating gate of the first transistor; and
  a diode coupled to the sense line and a node of the first transistor.

2. The apparatus of claim 1, wherein the diode is configured to prevent a current from flowing through the memory cell when the memory cell is an unselected cell during a program operation.

3. The apparatus of claim 1, wherein the apparatus includes:

a source line coupled to an additional node of the first transistor; and a common source plate coupled to the source line.

4. The apparatus of claim 1, wherein the memory cell is configured to store a data state using the first transistor and the second transistor.

5. The apparatus of claim 1, wherein:
the first transistor is a p-type metal-oxide-semiconductor (PMOS) transistor; and
the second transistor is an n-type metal-oxide-semiconductor (NMOS) transistor.

6. The apparatus of claim 1, wherein:
an n-type material of the diode is in contact with a p-type channel of the first transistor; and
a p-type material of the diode is in contact with an n-type channel of the second transistor.

7. The apparatus of claim 6, wherein the n-type channel of the second transistor is in contact with the sense line and the floating gate of the first transistor.

8. The apparatus of claim 1, wherein:
an n-type material of the diode is in contact with a p-type channel of the first transistor;
a p-type material of the diode is in contact with an n-doped material; and
the n-doped material is in contact with an n-type channel of the second transistor and the sense line.

9. An apparatus, comprising:
a plurality of sense lines;
a plurality of access lines; and
an array of memory cells, wherein each respective memory cell of the array includes:
a first transistor having a floating gate and a control gate, wherein the control gate of the first transistor is coupled to one of the access lines;
a second transistor having a control gate, wherein:
the control gate of the second transistor is coupled to the one of the of access lines;
a first node of the second transistor is coupled to one of the plurality of sense lines; and
a second node of the second transistor is coupled to the floating gate of the first transistor; and
a diode coupled to the one of the plurality of sense lines and a node of the first transistor.

10. The apparatus of claim 9, wherein:
the apparatus includes:
a common source plate; and
a plurality of source lines coupled to the common source plate; and
an additional node of the first transistor of each respective memory cell of the array is coupled to one of the plurality of source lines.

11. The apparatus of claim 10, wherein the common source plate is a ground plate.

12. The apparatus of claim 9, wherein the diode of each respective memory cell of the array is in series with the one of the plurality of sense lines and the node of the first transistor of that respective memory cell.

13. The apparatus of claim 9, wherein the diode of each respective memory cell of the array is a bipolar junction diode.

14. A method of operating memory, comprising:
applying, during a program operation being performed on the memory, a voltage to a sense line, wherein the sense line is coupled to:
a diode of a memory cell, wherein the diode is coupled to a node of a first transistor of the memory cell; and a first node of a second transistor of the memory cell, wherein a second node of the second transistor is coupled to a floating gate of the first transistor; and
preventing, by the diode of the memory cell, current from flowing from the sense line through the first transistor of the memory cell while the voltage is being applied to the sense line during the program operation.

15. The method of claim 14, wherein the method includes:
applying, during a sense operation being performed on the memory, a voltage to an access line, wherein the access line is coupled to:
a control gate of the first transistor of the memory cell; and
a control gate of the second transistor of the memory cell; and
allowing, by the diode of the memory cell, current to flow through the first transistor of the memory cell to the sense line while the voltage is being applied to the access line during the sense operation.

16. The method of claim 15, wherein the current that flows through the first transistor of the memory cell to the sense line first flows from a common source plate to a source line coupled to the common source plate, and from the source line to an additional node of the first transistor.

17. A method of operating memory, comprising:
selecting, during a program operation being performed on an array of memory cells, a memory cell of a subset of memory cells of the array, wherein each respective memory cell of the subset includes:
a first transistor having a floating gate and a control gate, wherein the control gate of the first transistor is coupled to one of a plurality of access lines coupled to the subset of memory cells;
a second transistor having a control gate, wherein:
the control gate of the second transistor is coupled to the one of the access lines;
a first node of the second transistor is coupled to a sense line coupled to the subset of memory cells; and
a second node of the second transistor is coupled to the floating gate of the first transistor; and
a diode coupled to the sense line and a node of the first transistor; and
preventing, by the diode of each respective unselected memory cell of the subset, current from flowing from the sense line through the first transistor of that respective unselected memory cell.

18. The method of claim 17, wherein selecting the memory cell of the subset comprises:
applying a voltage to the one of the access lines to which the control gates of the first and second transistors of that memory cell are coupled; and
applying a voltage to the sense line.

19. The method of claim 18, wherein the voltage applied to the one of the access lines is a voltage that exceeds a threshold voltage associated with the second transistor.

20. The method of claim 18, wherein the voltage applied to the sense line is a voltage that is less than the voltage applied to the one of the access lines.

21. The method of claim 18, wherein the voltage applied to the sense line is 0 Volts.

22. The method of claim 17, wherein the method includes:
selecting, during a sense operation being performed on the array of memory cells, a memory cell of the subset of memory cells of the array; and
allowing, by the diode of the memory cell of the subset selected during the sense operation, current to flow through the first transistor of the memory cell of the subset selected during the sense operation to the sense line.

23. The method of claim 22, wherein selecting the memory cell of the subset during the sense operation comprises:
applying a negative voltage to the one of the access lines to which the control gates of the first and second transistors of that memory cell are coupled; and
applying a negative voltage to the sense line.

24. The method of claim 23, wherein the negative voltage applied to the one of the access lines and the negative voltage applied to the sense line are a same voltage.

25. The method of claim 17, wherein the subset of memory cells comprises a column of memory cells of the array.

* * * * *